Figure 1:
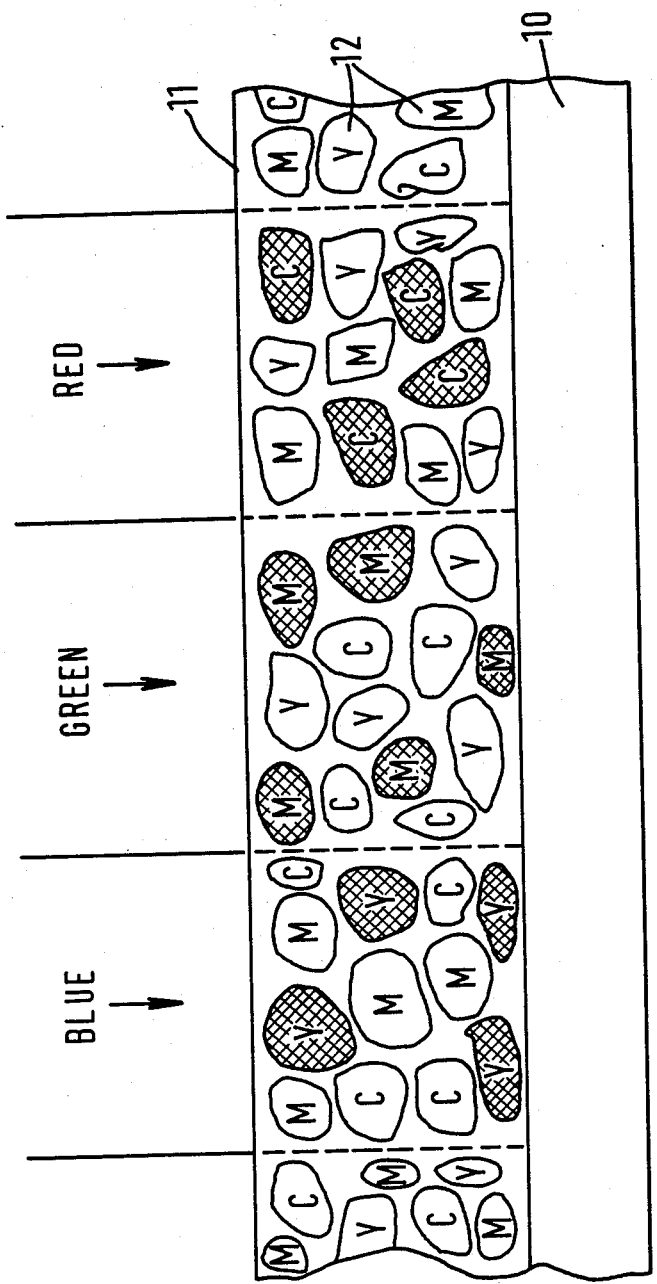

United States Patent [19]

Robillard

[11] Patent Number: 4,725,527
[45] Date of Patent: Feb. 16, 1988

[54] PHOTOSENSITIVE COMPOSITIONS FOR DIRECT POSITIVE COLOR PHOTOGRAPHY

[75] Inventor: Jean J. A. Robillard, Limerick, Ireland

[73] Assignee: Richard L. Scully, Charlottesville, Va.

[21] Appl. No.: 813,536

[22] Filed: Dec. 26, 1985

[30] Foreign Application Priority Data

Dec. 30, 1984 [IE] Ireland ................................ 2247/84

[51] Int. Cl.$^4$ ................................................ G03C 7/28
[52] U.S. Cl. .................................... 430/339; 430/156; 430/167; 430/333; 430/337
[58] Field of Search ............... 430/345, 962, 293, 333, 430/337, 339, 156, 167, 341

[56] References Cited

U.S. PATENT DOCUMENTS

| | | | |
|---|---|---|---|
| 1,880,572 | 10/1932 | Wendt et al. | 430/339 |
| 2,054,390 | 9/1936 | Rust et al. | 430/339 |
| 3,104,973 | 9/1963 | Sprague et al. | 430/339 |
| 3,510,308 | 5/1970 | Foris et al. | 430/345 |
| 3,595,655 | 7/1971 | Robinson et al. | 430/339 |
| 3,773,508 | 11/1973 | Osada et al. | 430/345 |
| 3,871,886 | 3/1975 | Robillard | 430/345 |
| 4,052,218 | 10/1977 | Samat et al. | 430/345 |
| 4,343,885 | 8/1982 | Reardon | 430/344 |
| 4,345,011 | 8/1982 | Drexhage | 430/333 |

FOREIGN PATENT DOCUMENTS

| | | |
|---|---|---|
| 2405501 | 10/1977 | France . |
| 48-29062 | 9/1973 | Japan . |
| 54-9894 | 4/1979 | Japan . |

*Primary Examiner*—Won H. Louie
*Attorney, Agent, or Firm*—Birch, Stewart, Kolasch and Birch

[57] ABSTRACT

The invention relates to a photosensitive composition for direct positive color photography. The photosensitive composition comprises a binder containing a plurality of grains of a semiconductor material, each grain having adsorbed on its surface one of three different complexes of spiropyran with a metal salt, each complex being sensitive to a different wavelength of light, a cross-linkable polymer and a free radical initiator. The photographic composition provides a non-silver photographic process based on the photo-decomposition of the metal-spiropyran complex absorbed on the grains of semiconductor material.

19 Claims, 9 Drawing Figures

PHOTOSENSITIVE COMPOSITIONS FOR DIRECT POSITIVE COLOR PHOTOGRAPHY

The present invention relates to a photosensitive composition for direct positive color photography.

According to the present invention there is provided a photosensitive composition comprising a binder containing a plurality of grains of semiconductor each having adsorbed on its surface one of three different complexes of spiropyran with a metal salt, each complex being sensitive to a different wavelength of light, a crosslinkable polymer and a free radical initiator.

The photographic composition according to the invention provides a non-silver photographic process based on the photo-decomposition of certain metal-organic compounds adsorbed on an organic semiconductor. The process, initiated by the absorption of light on a particular adsorbed molecule is amplified by further decomposition of the adscrbed specie by interaction with the semiconductor. The image is stabilized (fixed) by crosslinking a polymer contained in the composition. This crosslinking, promoted by heat, blocks the geometry of the products of decomposition and the complexes themselves, thereby preventing any further decomposition.

The new photographic process hereinafter described is extremely simple and produces a permanent color or transparency by exposure to an original and fixing by heat (infra-red lamp or hot air blower) without chemical development.

The photosensitive composition used for the formation of the image can be coated on a transparent film base or paper, leading to color transparencies or opaque prints. It can also be dispensed in the form of a spray allowing the formation of an image on any kind of substrate (walls, billboards, textile, posters, etc.).

Other materials may be added to the basic elements of the composition in order to perform specific functions not essential to the process but improving its performance.

The light sensitive materials suitable for the process are organometallic compounds resulting from the complexation of special heterocycles called spiropyrans with certain metal salts. The compound which is strongly colored discolors by dissociation. The dissociation can be promoted by light (photodissociation) or by interaction with the semiconductor. It is generally initiated by light and continues by interaction with the semiconductor thereby providing amplification.

The semiconductor can be inorganic, for use on opaque substrates (paper), or organic for use on transparent substrates (film).

The crosslinkable polymer, in admixture with the binder, can be any unsaturated polyester dissolved in styrene. The promotion of crosslinking is achieved by including free radicals initiators chosen from peroxides, peresters, peracids, benzoin derivatives, azides and diazo compounds.

The invention further provides a photosensitive article comprising three superimposed layers of a transparent semiconductor material each having adsorbed on its surface a layer of a different one of three complexes of spiropyran with a metal salt, each complex laYer being sensitive to a different wavelength of light and including a crosslinkable polymer and a free radical initiator.

Figure 2:
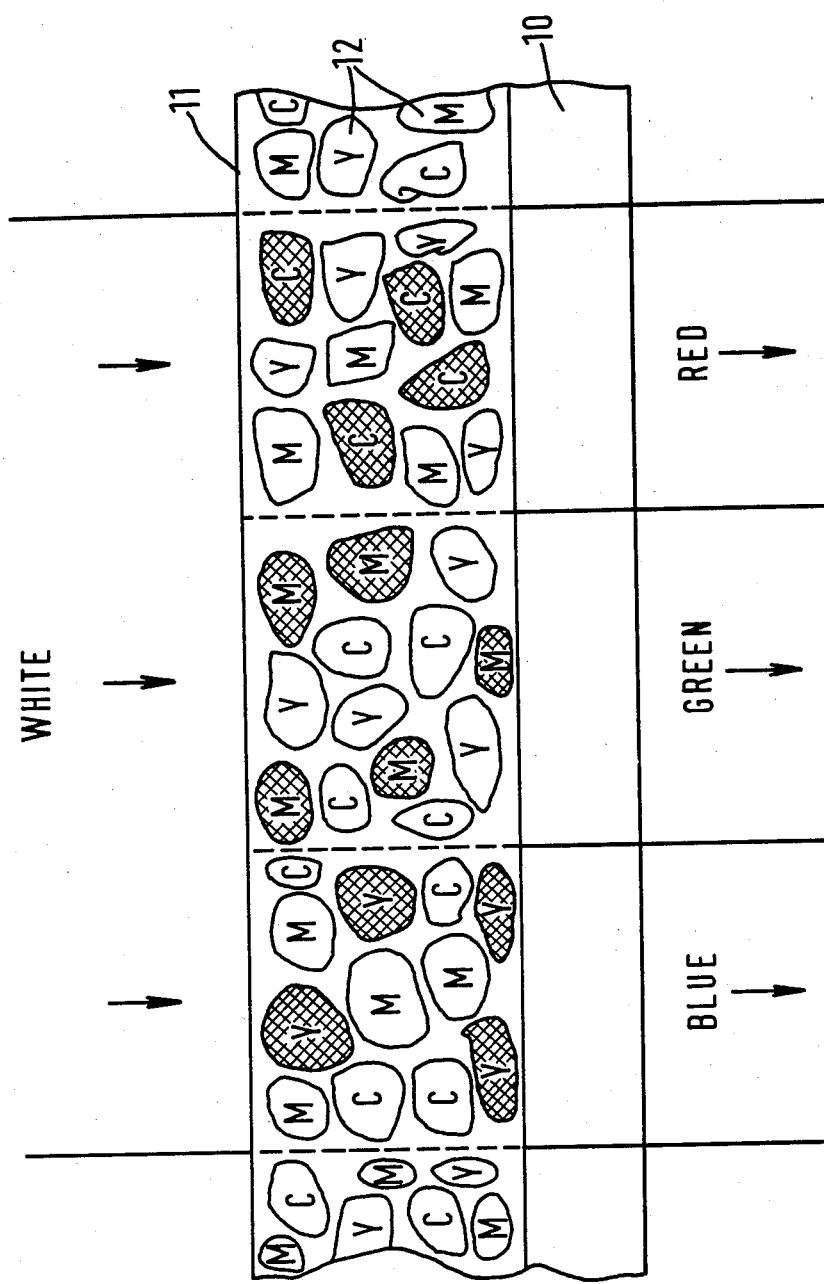
Figure 3:
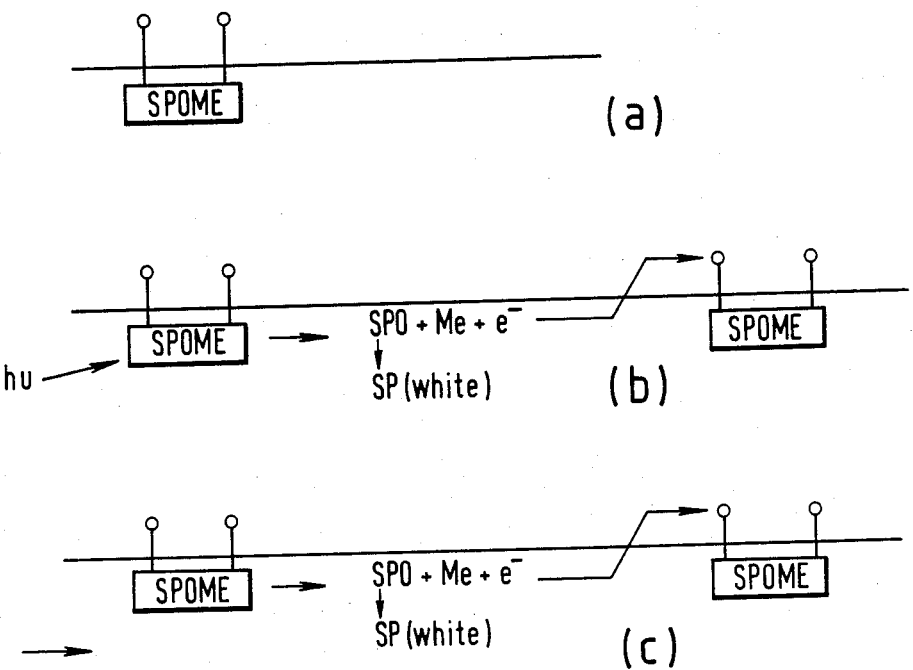

Embodiments of the invention will now be described, by way of example, with reference to the accompanying drawings, in which:

FIG. 1 is a cross-section through a photosensitive article according to a first embodiment of the invention, showing the effect of exposure of the article to colored light, FIG. 2 shows the effect of the illumination by white light of the article of FIG. 1 after exposure and fixing, FIG. 3 represents schematically (a) the molecules of spiropyran complexes (SPOME) adsorbed on the surface of a semiconductor grain, (b) the initial photodissociation, and (c) the subsequent dissociations due to the electrons released from the initial photodissociation, FIGS. 4 to 7 illustrate applications of the invention using the photosensitive composition described in relation to FIGS. 1 and 2, and FIGS. 8 and 9 are cross-sections through a further embodiment of the invention.

Referring to FIG. 1, a photosensitive article for producing a direct positive photographic transparency comprises a transparent substrate 10 bearing a layer 11 containing a large number of minute, densely packed grains 12 of a transparent organic semiconductor material. Each grain 12 has adsorbed on its surface one of three different organometallic complexes of spiropyran with a metallic salt, each complex being sensitive to a different one of the three primary colors red, blue and green. In the layer 11 the three types of grains 12 ate dispersed evenly and in equal amounts in a binder which contains a crosslinkable polymer and an additive to promote crosslinking. Examples of specific materials and substances which may be used to form the article, and the method of making it, will be described in detail hereafter. It is to be understood that FIG. 1 is schematic only, and is not to scale. When the sensitive layer 11 is exposed to a colored image, as indicated schematically in FIG. 1 by the parallel red, blue and green beams, each organometallic complex will absorb light of the wavelength to which it is sensitive whereby some molecules of the complex are initially bleached in the area struck by the light.

The process initiated on one grain will continue to cover the entire surface of the grain, due to the interaction between the initial bleached molecule and the semiconductor, resulting in a completely transparent grain. This interaction provides a system of amplification responsible for the sensitivity (speed) of the process. The mechanism can be explained as follows:

If SPO represents the open form (merocyanine) of a spiropyran SP, its complexation with a metal salt MeX leads to the complex SPOME according to:

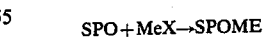

The complexes $(SPOME)_1$, $(SPOME)_2$, $(SPOME)_3$ ... $(SPOME)_n$ are all adsorbed on the same grain of semiconductor. The initial photodecomposition:

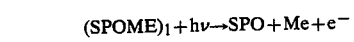

provides an electron which is trapped at the adsorption site of $(SPOME)_2$ which desorbs and decomposes according to:

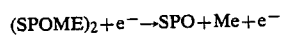

This new electron is itself trapped at the adsorption site of (SPOME)₃ which desorbs and decomposes according to:

$$(SPOME)_3 + e^- \rightarrow SPO + Me + e^-$$

The chain reaction progresses until all the molecules SPOME on the surface of the grain are decomposed $$(SPOME)_m + e^- \rightarrow SPO + Me + e^-$$

This amplification mechanism is illustrated in FIG. 3. The selective bleaching of the grains by the different color components in the image whch exposes the layer 11 will leave a direct positive image in the layer. By proper selection of the three organometallic complexes adsorbed on the grains an accurate color rendition is obtained by a subtractive process.

For example, green sensitive grains may be obtained using a magenta metal-organic compound adsorbed on a transparent organic semiconductor. These magenta grains M (FIG. 1) will absorb green and transmit blue and red freely. When the film is exposed imagewise with a colored light, the action of green light is to bleach the magenta grains. These grains remain unaffected by blue or red light which are not absorbed by the material. What is obtained in the layer, therefore, is a minus-green record which corresponds, for example, with the magenta printer in conventional color printing processes.

Similarly, blue sensitive grains Y, comprising a yellow metal organic compound adsorbed on a transparent organic semiconductor, are bleached on exposure to blue light, giving a minus-blue record which corresponds to the yellow printer in conventional printing processes.

Finally red sensitive grains C, containing a cyan metal organic compound adsorbed on a transparent organic semiconductor, are bleached by red light, giving a minus red image corresponding to the cyan printer in color printing processes.

The effect of light of the primary colors, blue, green and red on the layer 11 is illustrated in FIG. 1. Since the red sensitive cyan grains C and the green sensitive magenta grains M transmit blue light freely, they are not affected by this light, but the blue sensitive yellow grains Y do incur bleaching in this area as indicated by the crosshatching. Therefore in the area of the layer 11 struck by blue light, there remain only the cyan and magenta grains. After fixing, which can be accomplished by short heating, if such an exposed area is viewed under white light, the cyan grains C will absorb red light and the magenta grains M will absorb green light, while both the cyan and magenta grains will transmit blue freely as shown in FIG. 2.

In this way the result is transmission of only blue in the area which was originally struck by blue light; in other words a direct positive is obtained. Similarly, in the area struck by the green light, the cyan and yellow grains C and Y will transmit the green light freely while the magenta grains M will absorb the green light and be bleached. Since the cyan grains and the yellow grains are still intact and the former will absorb red while the latter will absorb blue, the net transmission from the area will be green; again, a direct positive. Finally, in the area struck by the red light, the cyan grains C will absorb this radiation and be bleached. The green and blue sensitive grains M and Y will be unaffected. Upon illumination with white light the magenta grains will absorb the green light, the yellow grains will absorb the blue light, and the net transmission from the combined three grains will be red.

This direct positive photographic process is useful for providing positive transparencies for projection when the photosensitive composition is coated on a clear film base, as described above, or for color prints in which case the grains are coated on a white opaque substrate or sprayed on any opaque substrate with clear background. In the case of prints the semiconductor material forming the grains may be an inorganic opaque semiconductor, as transmission through the grains is not required.

As indicated above, the semiconductors used in the invention can be inorganic or organic.

Suitable inorganic semiconductors are white doped metal oxides such as zinc oxide, tin oxide, titanium oxide, zirconium oxide, lead oxide and most of the rare earth oxides.

Suitable organic semiconductors can be classified in two categories:

a. Doped aromatic compounds.
b. Coordination metal complexes of polymers.

In the first category are, for example, polyvinylcarbazole (PVK), polynaphthazarene, pyrazoline polymers, polyazine and polyphenylacetylene.

In the second category are, for example, the Cu(I), Cu(II), Ni(II) and Pd(II) complexes of polyaminoquinone, polyvinylalcohol, polydithioxamide, polythiocarbamic acid, polyquinoxalophenazine and other polymers prepared from:

5,5'-methylenebis salicylaldehyde
4,4' bis (α, thioaldylpyridine amino)diphenyl
2,3 - dihydroxynaphthalene-1,5- dialdoxine All polymers are granulated in powder form with grains smaller than 10 microns.

The metal organic complexes used in the invention are metal complexes made from spiropyran compounds.

Suitable spiropyrans contain at least one pyran ring having in the ortho or meta position to the oxygen atom a condensed benzonaphtho or other higher aromatic polycyclic condensed ring system including those condensed ring or ring systems in substituted state, e.g. an anthraceno or a phenanthreno ring system, as present, for example, in spirodibenzopyran, spirodinaphthopyran, spirobenzonaphthopyran, 1,3,3 trimethylindolinonaphthospiropyran or such spiropyran containing condensed aromatic nuclei of the anthracene or phenanthrene type.

In the spiropyrans the pyran rings, the condensed benzo, the condensed higher aromatic rings as well as the 1,3,3 trimethylindolino ring may be substituted.

Suitable substituents are hydrocarbon groups i.e. alkyl groups such as, for example, methyl, substituted alkyl groups (halogen or phenyl substituted), alkylene ester groups, alkylene carboxyl groups, carbamide groups or substituted carbamide groups, halogen, nitro, hydroxy, alkoxy, aryloxy etc.

General formulae covering particularly suited spiropyrans are illusted hereafter:

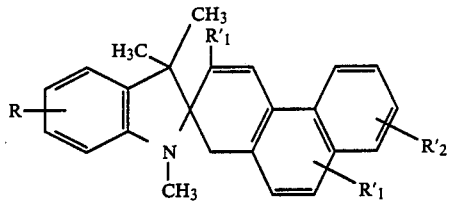

I

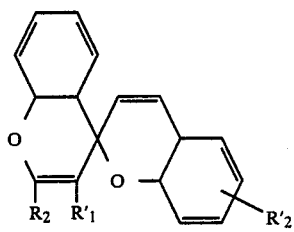

II

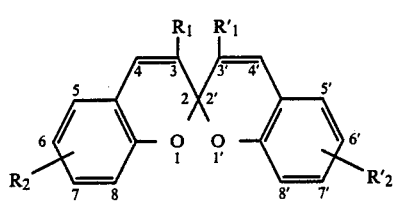

III

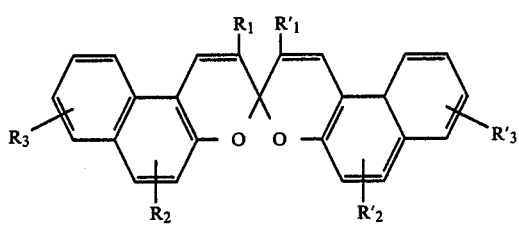

IV

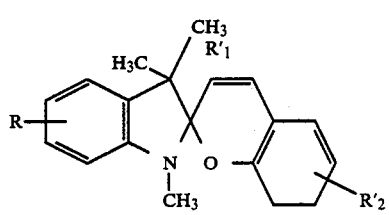

V wherein:

R, $R_1$, $R'_1$, $R_2$, $R'_2$, $R_3$ and $R'_3$ represent hydrogen, an aliphatic group including a substituted aliphatic group such as, for example, methyl, ethyl, propyl, amyl or hexadecyl groups or halogen substituted alkyl groups, halogen, nitro, hydroxy, an alkoxy or aryloxy group, a phenyl group or a substituted phenyl group, piperidyl, an alkylene ester group, an alkylene carboxyl group, a carbamide group or a substituted carbamide group.

The metal salts applicable for the complexation of the spiropyran compounds for use in the compositions according to the invention, include the halides, nitrates, sulphates, acetates, salicylates, benzoates of copper, nickel, cobalt, lead, zinc, mercury, antimony, bismuth, barium, molybdenum and tungsten. The fatty acid salts including stearates, behenates and naphthenates of copper, nickel, cobalt, lead, zinc, mercury, antimony, bismuth, barium, molybdenum and tungsten.

The coloration of each type of grain is obtained by immersion in a solution containing both the spiropyran and the complexing salt, the complexation then takes place on each grain and the resulting complex remains adsorbed on the surface of the grains. After agitation of the grains in the complexing solution for a time varying from ten to sixty minutes, the grains are filtered and dried. They are subsequently dispersed in a binder solution with a proportion of 5:1, the binder containing a crosslinkable polymer and a free radical initiator as indicated above. Three dispersions corresponding to the three types of grains (magenta, yellow and cyan) are then intimately mixed to form the emulsion. This emulsion is coated on transparent film (for organic semiconductor only), on white paper or conditioned in a spray can.

Color complexes applicable to the preparation of grains for photosensitive emulsions according to the invention are, for example:

FOR MAGENTA GRAINS

The complex of 1,3-dimethyl-3-isopropy-6' nitro-spiro (2'H-1-benzopyran-2,2'-indoline) with cobaltous chloride, the complex of 1,3,3-trimethyl-7'-nitro-spiro (2'H-1'-benzopyran-2,2'-indoline) with zinc naphthenate, the complex of 1,3,3-trimethyl-5-chloro-5'-nitro-8'-methoxy-spiro (2'H-1'-benzopyran-2,2'-indoline) with lead naphthenate, the complex of 1,3,3-trimethylindol-nonaphthospyran with cobaltous chloride.

FOR YELLOW GRAINS

The complex of 1,3,3-trimethyl-nitro spiro (2'H-1'-benzo-pyran-2,2'-indoline) with tin chloride, the complex of 3,3'-dimethyl-6'-nitro-spiro (2'H-1'-benzopyran-2,2'-benzoxazole) with zinc chloride, the complex of 3-methyl-6-nitro spiro- (2H-1-benzopyran-2,2'- (2'H-1'-beta naphthopyran) with antimony trichloride.

FOR CYAN GRAINS

The complex of 1,3,3-trimethyl-nitro-spiro (2'H-1'-benzo-pyran-2,2'-indoline) with barium naphthenate, the complex of 6'-nitro-8'-methoxy-1,3,3-trimethyl-indolino- benzopyrilo-spiran with barium naphthenate, the complex of 1-phenyl-3,3-dimethyl-6'-nitro-8'-methoxy-spiro (2'H-1'-benzobetanaphtopyran) with mercurous chloride.

Following are examples of the invention:

EXAMPLE 1

| A dispersion containing: | |
|---|---|
| Polyvinylacetate | 16.5 g |
| Toluene | 7.5 g |
| Ethylacetate | 16.0 g |
| Magenta grains (PVK) | 4.0 g |
| Yellow grains (PVK) | 4.0 g |
| Cyan grains (PVK) | 4.0 g |
| Benzoyl peroxide | 0.1 g |
| Ludopal P6 (Lupodal P6 is a Trade Mark) | 5.0 g |
| Tributhylphosphate | 1.5 g | was coated on a standard 0.005 inch cellulose acetate clear film and dried.

The resultant sensitized film was exposed by projection of a color slide with a 300 watt projector, the projected image being 2.8 times the size of the slide. After 30 seconds exposure, a picture was obtained which was a satisfactory copy of the slide.

EXAMPLE 2

In place of the cellulose acetate film used in Example 1, an opaque sheet of paper was coated in a similar manner. The resulting sensitized sheet, when exposed by projection of a slide under the same conditions as in Example 1, gave a satisfactory copy of the slide with true reproduction of the colors of the original.

EXAMPLE 3

| A dispersion containing: | |
|---|---|
| Polyvinylchloride | 2.5 g |
| Cyclohexanone | 32.5 g |
| Toluene | 5.0 g |
| Ludopal P6 | 5.0 g |
| Benzoyl peroxide | 0.1 g |
| Tributylphosphate | 1.5 g |
| Magenta grains (TiO$_2$) | 11.0 g |
| Yellow grains (TiO$_2$) | 11.0 g |
| Cyan grains (TiO$_2$) | 11.0 g | was coated on a sheet of white paper.

The resulting sensitized sheet, when exposed by projection of a slide in the same manner as described in the previous examples gives a true color reproduction of the projected original.

In addition to forming transparencies and prints as described above, the invention may be used in various diverse applications as shown in FIGS. 4 to 7.

Figure 4:
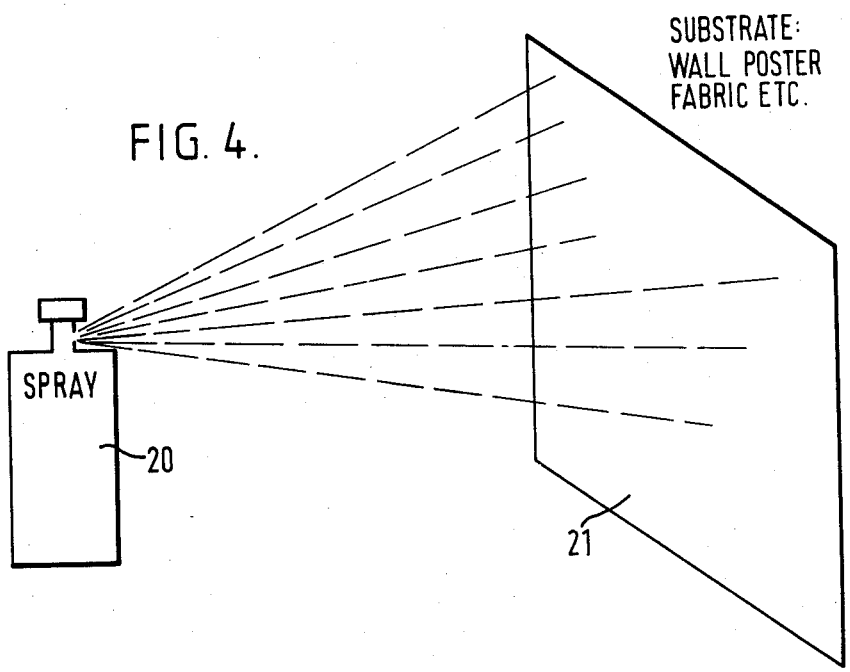

These Figures are largely self-explanatory, but briefly:

FIG. 4 shows a photosensitive composition incorporated into a spray 20 for application to a wall, poster, fabric or other substrate 21 for subsequent exposure.

Figure 5:
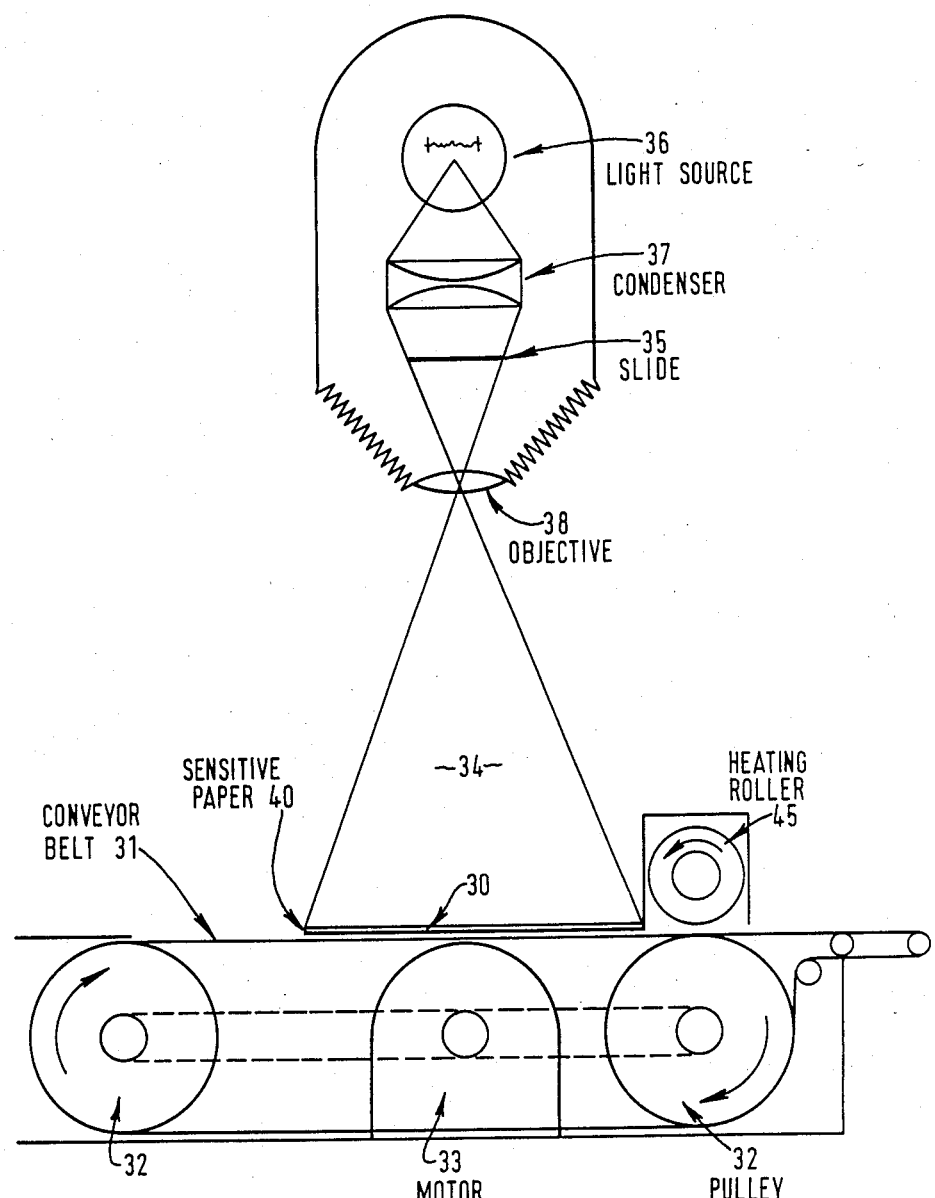

FIG. 5 illustrates a printer for color slides in which successive sheets 30 of paper bearing a photosensitive composition as described above are conveyed by a conveyor belt 31, driven by pulleys 32 and a motor 33, to an exposure station 34. At the exposure station each sheet 30 is exposed to a colored slide 35 by means of an optical system comprising a light source 36, condenser 37 and objective 38.

Figure 6:
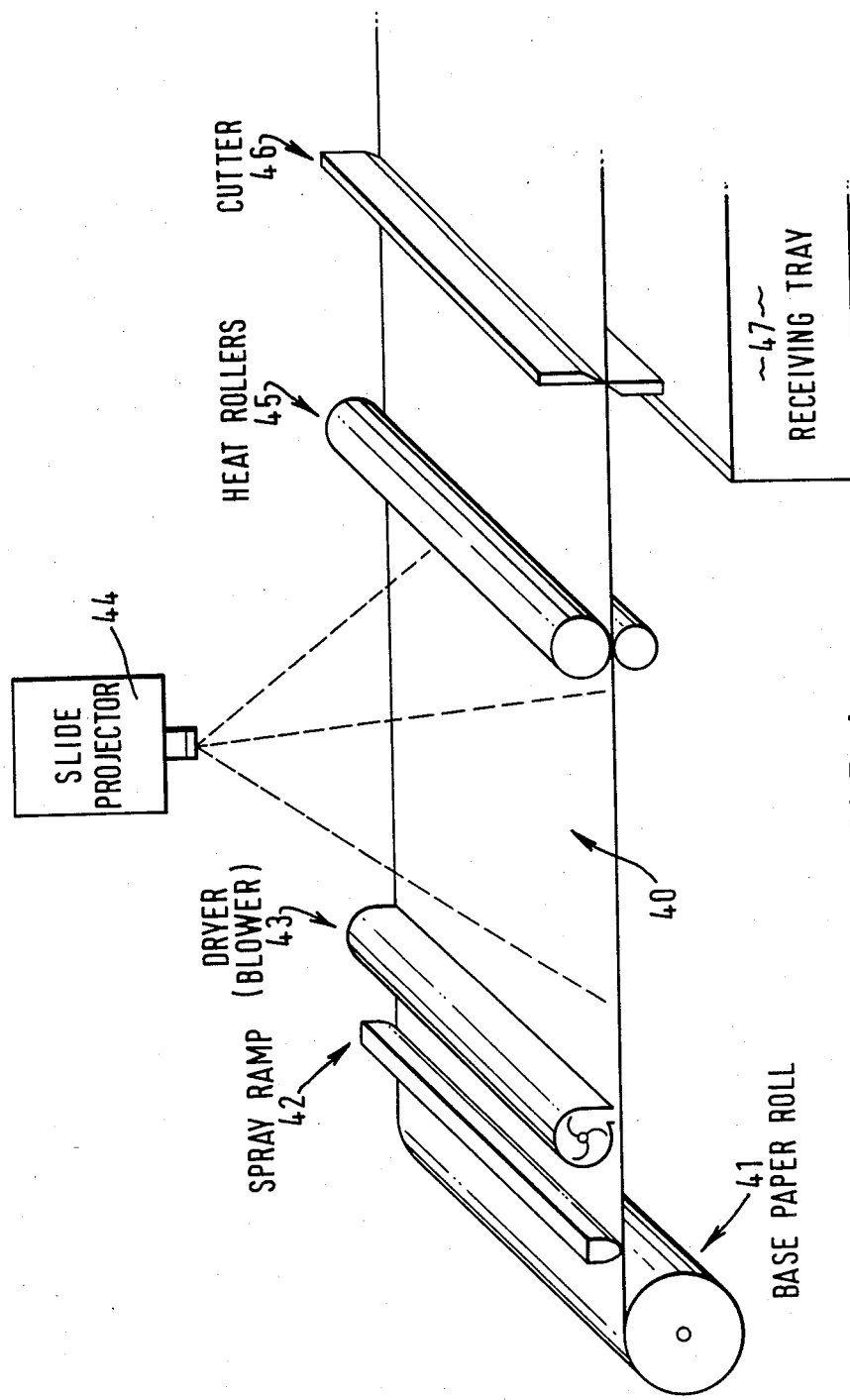

FIG. 6 shows a system for intermittent printing on paper or fabric 40 from a roll 41. The photosensitive composition is applied at 42 and dried at 43, whereafter the paper 40 is intermittently exposed by a slide projector 44. The image is fixed by heat rollers 45 and then the paper is cut to length by a cutter 46 and the cut lengths are received in a tray 47.

Figure 7:
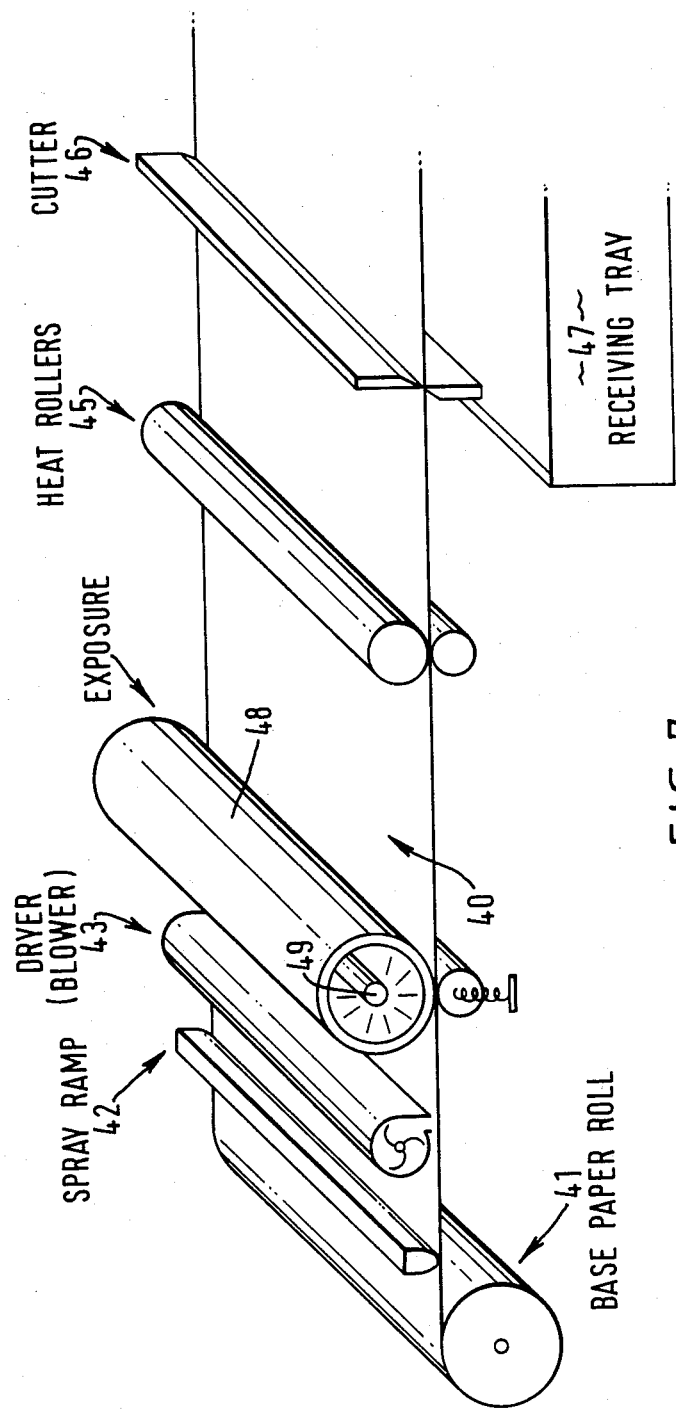

FIG. 7 shows a system similar to FIG. 6 (the same reference numerals have been used for similar components) for printing on a continuously moving paper or fabric sheet 40. In this case exposure is through a glass cylinder 48 bearing the transparency to be printed, a light source 49 being contained within the cylinder and the cylinder being rotated with the movement of the sheet 40.

Figure 8:
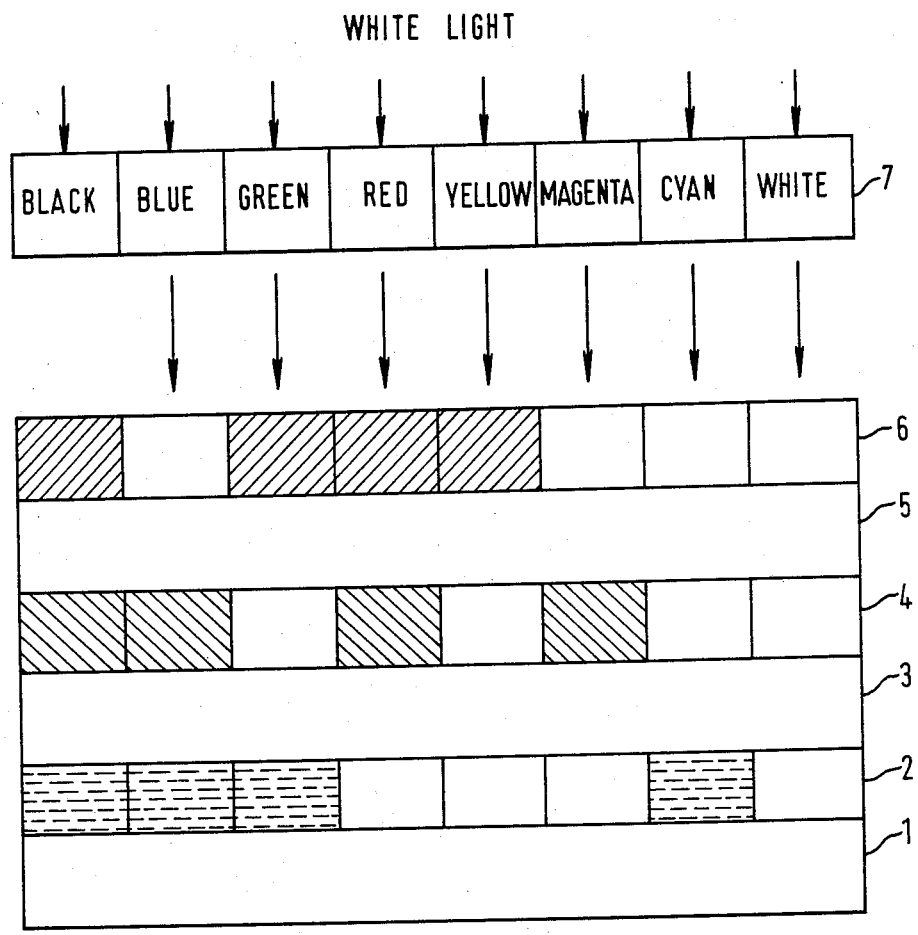

The embodiment illustrated in FIG. 8 is an alternative to FIG. 1 for providing transparencies but makes use of the same general principles i.e. selective bleaching with amplification by interaction with a semiconductor. It is a multi-layer structure rather than a single-layer grain structure. It comprises a succession of organometallic complex layers each adsorbed on a negative transparent (organic) semiconductor layer. The binder will still be necessary to introduce the crosslinkable polymer and free radical initiator responsible for the fixing. To reach a given set of two layers (complex and associated semiconductor) the light has to cross the other sets of layers on top of it, which means that these layers should not absorb in the spectral range characteristic of the absorption of the given set of layers. The color selection is then performed in depth through the different layers rather than laterally with the three different kinds of grains.

In FIG. 8:

1 represents a transparent organic semiconductor;

2 is a bleachable yellow complex dispersed (or dissolved) in a binder containing a crosslinkable polymer and additives to promote the crosslinking;

3 shows another transparent organic semiconductor layer;

4 is a bleachable magenta complex dispersed (or dissolved) in a binder containing a crosslinkable polymer and additives to promote the crosslinking;

5 represents a third transparent organic semiconductor layer;

6 is made of a bleachable cyan complex dispersed (or dissolved) in a binder containing a crosslinkable polymer and additives to promote the crosslinking.

For producing a print rather than a transparency, the layer 1 represents an opaque substrate (paper or cardboard) coated with an organic semiconductor.

The operation of the layer structure is as follows, it being assumed that the layer structure is illuminated with white light via a filter 7 having colored regions as shown.

Figure 9:
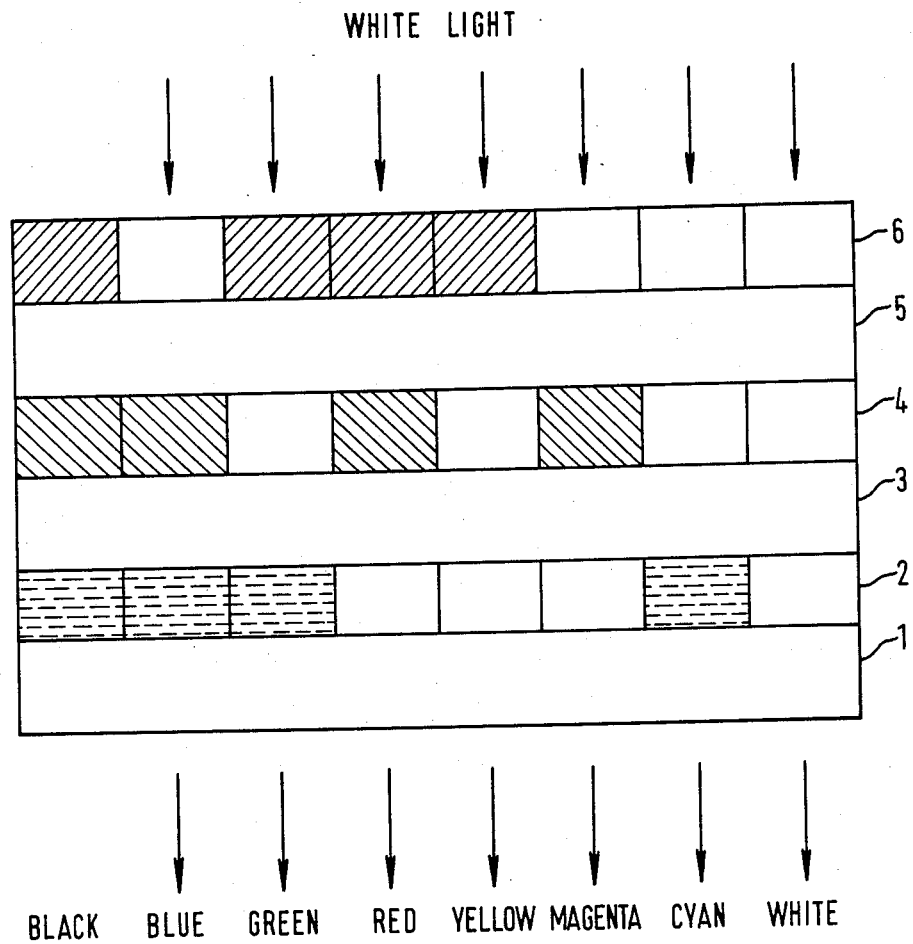

Since the red sensitive layer 2 on its semiconductor support 1 and the green sensitive layer 4 on its semiconductor support 3 transmit blue light freely, the only effect with blue light, or light such as magenta, cyan or white which contains blue as a component, is on layer 6, where the yellow complex is bleached in the areas struck by blue light. This is shown in FIG. 8 where the bleached areas are shown white and the unbleached areas are shaded. Therefore in the corresponding areas of the layers 2 and 4 the cyan layer and the magenta layer are unaffected. After fixing with heat, through the crosslinking process in the binder, if such an exposed structure is viewed under white light, the cyan layer will absorb red light, the magenta layer will absorb green light; while both the cyan layer and the magenta layer will transmit blue freely, as shown in FIG. 9. The same reasoning applies to the reflection of light on a stack of layers deposited on an opaque substrate.

In this way, the result is reflection or transmission of only blue in the area struck by blue light or light containing a blue component; in other words a direct positive is obtained. Similarly when green strikes the layer structure, the cyan complex will transmit the green freely while the magenta complex will absorb the green light and be bleached. Since the cyan and yellow complexes are still intact and the former will absorb red while the latter will absorb blue, the net reflection or transmission from the bleached layer will be green; again a direct positive. Finally, in the area struck by red light, the cyan complex will absorb this radiation and be bleached while the green- and blue- sensitive layers will be unaffected. The magenta complex will absorb the green light, the yellow complex will absorb the blue light, and the net reflection, or transmission from the combined layers will be red.

The layer structure of FIG. 8 should be made of continuous grainless layers, allowing for high resolution. The materials used may be the same as previously described for the embodiment of FIG. 1.

I claim:

1. A direct positive color photosensitive composition comprising a binder containing a plurality of grains of semiconductor each having adsorbed on its surface one of three different photo-bleachable colored complexes of spiropyran with a metal salt, each complex being sensitive to a different wavelength of light of the three primary colors red, blue and green, a crosslinkable polymer, and a free radical initiator.

2. The photosensitive composition of claim 1, wherein the binder is selected from the group consisting of polyvinyl alcohol, polyvinyl acetate, polyvinylpyrrolidone, carboxyethylcellulose, hydroxyethylcellulose and polyvinylchloride.

3. The photosensitive composition of claim 1, wherein the semiconductor grains are made of an inorganic semiconductor selected from the group consisting of zinc oxide, tin oxide, titanium dioxide, zirconium oxide, lead oxide, lanthanum oxide and cerium oxide.

4. The photosensitive composition of claim 1, wherein the semiconductor grains are made of an organic semiconductor of doped aromatic compounds selected from the group consisting of polyvinylcarbazole, polynaphthazarene, pyrazoline polymers, polyazines and polyphenylacetylene.

5. The photosensitive composition of claim 1, wherein the spiropyran complexes adsorbed on the semiconductor grains are made of spiropyran selected from the group consisting of spirodibenzopyrans, spirodinaphthopyrans, spirobenzonaphthopyrans, 1,3,3 trimethylindolinobenzospiro-pyran and 1,3,3 trimethylindolinonaphthospiropyran.

6. The photosensitive composition of claim 1, wherein the semiconductor grains are made of an organic semiconductor of coordination metal complexes of polymers selected from the group consisting of Cu(I), Cu(II), Ni(II), and Pd(II) complexes of polyaminoquinone, polyvinyl alcohol, polydithioxamide, polythiocarbamic acid and polyquinoxalophenazine.

7. The photosensitive composition of claim 1, wherein the spiropyran complexes adsorbed on the semiconductor grains are complexed with metal salts selected from the group consisting of cuprous chloride, zinc chloride, cobaltous chloride, mercurous chloride, antimony chloride, bismuth chloride, barium naphthenate, lead naphthenate and zinc naphthenate.

8. The photosensitive composition of claim 1 wherein the crosslinkable polymer is an unsaturated polyester dissolved in styrene.

9. The photosensitive composition of claim 1, wherein the free radical initiator is selected from the group consisting of peroxides, peresters, peracids, benzoin derivatives, azides and diazocompounds.

10. A spray containing the composition of claim 1.

11. A photosensitive article comprising a substrate bearing a layer of a composition according to claim 1.

12. A photographic process, which comprises providing a layer of a composition according to claim 1 on a substrate, exposing the layer to a colored image, and heating the exposed layer to fix the image therein and to destroy the photosensitivity of the layer.

13. A direct positive color photosensitive article comprising three superimposed layers of a transparent semiconductor material each having adsorbed on its surface a layer of a different one of three photo-decomposable complexes of spiropyran with a metal salt, each complex layer being sensitive to a different wavelength of light and including a crosslinkable polymer and a free radical initiator.

14. The photosensitive composition of claim 1, wherein a first complex of spiropyran with a metal salt is sensitive to red light, a second complex of spiropyran with a metal salt is sensitive to green light and a third complex of spiropyran with a metal salt is sensitive to blue light.

15. The photosensitive composition of claim 11, wherein the substrate is selected from the group consisting of transparent film base, paper, walls, billboards, textile and posters.

16. The photosensitive composition of claim 6, wherein the polymers are granulated in powder form with grains smaller than 10 microns.

17. The photosensitive composition of claim 1, wherein said spiropyran is a member selected from the group of Formula I-V:

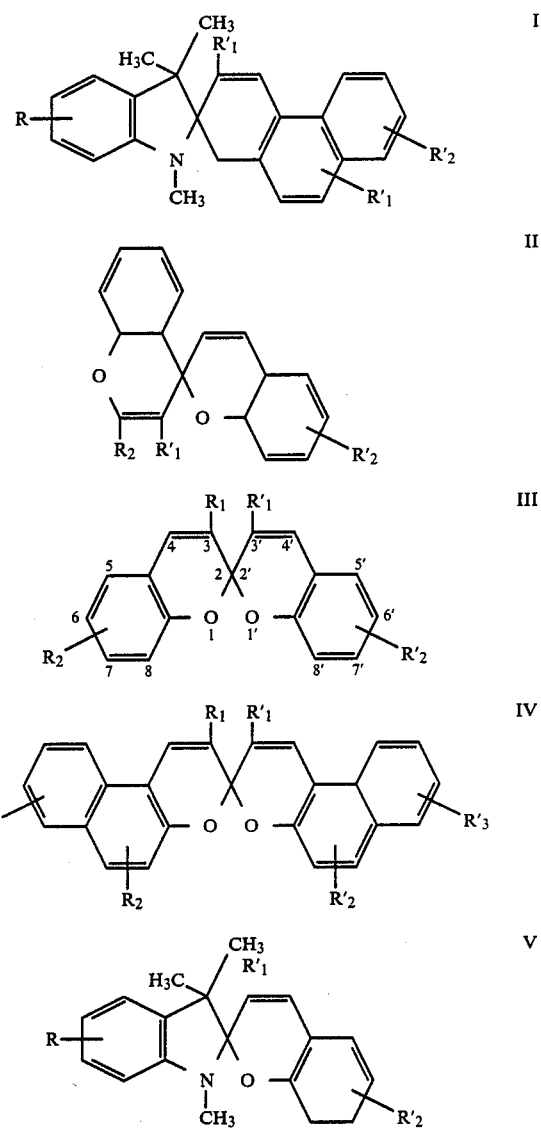

wherein R, $R_1$, $R'_1$, $R_2$, $R'_2$, $R_3$ and $R'_3$ represent hydrogen, an aliphatic group, halogen, nitro, hydroxy, alkoxy, aryloxy, a phenyl group, a substituted phenyl group, piperdyl, an alkylene ester group, an alkylene carboxyl group, a carbamide group or a substituted carbamide group.

18. A direct positive color photosensitive article, which comprises:
a substrate,
a first doped organic semiconductor, a bleachable yellow spiropyran and metal salt complex dispersed or dissolved in a binder containing a crosslinkable polymer and additives to promote crosslinking;

a second doped organic semiconductor layer, a bleachable magenta spiropyran and metal salt complex dispersed or dissolved in a binder containing a crosslinkable polymer and additives to promote crosslinking, a third doped organic semiconductor layer, a bleachable cyan spiropyran and metal salt complex dispersed or dissolved in a binder containing a crosslinkable polymer and additives to promote crosslinking.

19. The photosensitive composition of claim 1, wherein the semiconductor is doped.

* * * * *